United States Patent [19]

McManus

[11] Patent Number: 5,226,014
[45] Date of Patent: Jul. 6, 1993

[54] LOW POWER PSEUDO-STATIC ROM

[75] Inventor: Michael J. McManus, Thornton, Colo.

[73] Assignee: NCR Corporation, Dayton, Ohio

[21] Appl. No.: 633,733

[22] Filed: Dec. 24, 1990

[51] Int. Cl.$^5$ .............................................. G11C 7/00
[52] U.S. Cl. ...................................... 365/210; 365/227
[58] Field of Search ............... 365/210, 205, 203, 226, 365/227, 228, 229

[56] References Cited

U.S. PATENT DOCUMENTS

| | | | |
|---|---|---|---|
| 4,031,524 | 6/1977 | Heeren | 340/173 |
| 4,053,873 | 10/1977 | Freeman et al. | 340/173 |
| 4,107,556 | 8/1978 | Stewart et al. | 307/362 |
| 4,274,013 | 6/1981 | Clemons et al. | 307/530 |
| 4,412,143 | 10/1983 | Patella et al. | 307/530 |
| 4,578,778 | 3/1986 | Aoyama | 365/227 |
| 4,715,015 | 12/1987 | Mimoto et al. | 365/210 |
| 4,716,320 | 12/1987 | McAdams | 307/530 |
| 4,730,280 | 3/1988 | Aoyama | 365/205 |
| 4,748,596 | 5/1988 | Ogura et al. | 365/205 |
| 4,777,625 | 10/1988 | Sakui et al. | 365/227 |
| 4,799,197 | 1/1989 | Kodama et al. | 365/205 |
| 4,831,287 | 5/1989 | Golab | 307/530 |
| 4,947,376 | 8/1990 | Arimoto et al. | 365/205 |
| 5,029,136 | 7/1991 | Tran et al. | 365/205 |
| 5,127,739 | 7/1992 | Duvvury et al. | 365/205 |

FOREIGN PATENT DOCUMENTS

276259 3/1990 Japan .................................. 365/227

Primary Examiner—Eugene R. LaRoche
Assistant Examiner—Tan Nguyen
Attorney, Agent, or Firm—Jack R. Penrod

[57] ABSTRACT

A pseudo-static ROM circuit which uses cross-coupled sense amplifiers to provide rapid accesses to ROM stored data, yet because of a special bit line precharger and dummy load arrangement dissipates very little static power. After a stable logic static is attained by the sense amplifier during a READ, the sense amplifier and the precharger-dummy load circuits do not draw any appreciable current or power until the next precharge-and-READ operation is initiated. Therefore, almost all of the power dissipated by the pseudo-static ROM occurs during the dynamic operations of precharging and READing the bit lines.

20 Claims, 5 Drawing Sheets

LOW POWER PSEUDO-STATIC ROM

BACKGROUND OF THE INVENTION

The present invention relates to read only memories (ROMs), and more particularly to pseudo-static ROMs having a sense amplifier arrangement which lowers the power dissipated during normal READ operations.

Pseudo-static ROMs are commonly used in application specific integrated circuits (ASICs) and other types of integrated circuits which require "on-chip ROM" because of their lower power dissipation characteristics. A general description of a pseudo-static ROM ASIC cell is given at pages 609 and 610 of the *NCR ASIC Data Book*, published in 1989 by NCR Corporation, Dayton, Ohio. Pseudo-static ROMs are distinguishable from true static ROMs by the presence of dynamic loads on the bit lines of the former.

This dynamic load, which includes a precharger circuit, charges a first set of bit lines to a predetermined voltage. At the same-time, a second identical precharger circuit precharger circuit charges a second set of bit lines to the same predetermined value. Each bit line in one set has a corresponding line that is part of the other set. After the precharger circuits have precharged their respective bit lines, a memory cell associated with a bit line of one of the sets is selected. Each bit line of the first set has a corresponding bit line in the second set, forming a pair of bit lines for accessing part of the pseudo static ROM. A sense amplifier is connected between a pair of bit lines and amplifies the difference between them until a stable state is attained. Each sense amplifier has a two terminal differential input and a high differential gain. Each of the differential input terminals is connected to a respective bit line of a bit line pair. Connected in this manner, each sense amplifier will invert, amplify and drive its differential input into two complementary binary states. Each sense amplifier has its differential outputs cross-coupled back to its inputs, in a manner similar to that of a flip-flop, such that once the sense amplifier attains a binary state, the cross-coupled, positive feedback will retain that state until after the ROM is again cycled into the precharge mode.

Commercially available pseudo-static ROMs use either slow, low power output buffers instead of the sense amplifiers, or they use fast sense amplifiers which dissipate static power during a READ of the bit lines. On a densely populated integrated circuits, the excess current and the excess heat dissipation of a heavily used ROM can become a limiting factor to how small the integrated circuit can be. And, since size effects processing speed and also integrated circuit manufacturing efficiency, it is desirable to reduce excess current and heat dissipation whenever possible.

Therefore, it is an object of this invention to provide a pseudo-static ROM device that has sense amplifiers and also has low power dissipation.

It is another object of this invention to provide a sense amplifier, and a precharger and dummy cell circuit arrangement for use in a pseudo-static ROM or similar device which operates with greatly reduced power dissipation.

SUMMARY OF THE INVENTION

According to one aspect of the invention, the foregoing objects are achieved by providing a semiconductor memory device which includes first and second bit lines which are formed on a semiconductor substrate. The first bit line is crossed by a first word line and a first dummy cell enable line. The second bit line is crossed by a second dummy cell enable line. A memory cell is formed at a cross over point of the word line and the first bit line. Also, a first dummy cell is formed at a cross over point of the first dummy cell enable line and the first bit line. Similarly, a second dummy cell is formed at a cross over point of the second dummy cell enable line and the second bit line. A sense amplifier is connected to the bit lines for sensing and amplifying a difference between the first bit line that is connected to the memory cell at a first input thereof and the second bit line that is connected to the second dummy cell at a second input thereof in order to READ a data bit stored therein. If the data bit READ is a logic LO, the first bit line is pulled towards logic LO by the memory cell. As the bit line is pulled towards logic LO, the sense amplifier turns a turn-off device within the second dummy cell to a non-conducting state. This turn-off device turns the second dummy cell OFF and prevents any dissipating of power in the second dummy cell thereafter.

BRIEF DESCRIPTION OF THE DRAWINGS

While the specification concludes with the appended claims particularly pointing out and distinctly claiming the subject matter which is regarded as the invention, it is believed that the invention will be better understood from the following detailed description of the illustrative embodiment taken in conjunction with the accompanying drawings in which:

DETAILED DESCRIPTION OF A PREFERRED EMBODIMENT

Figure 1A:
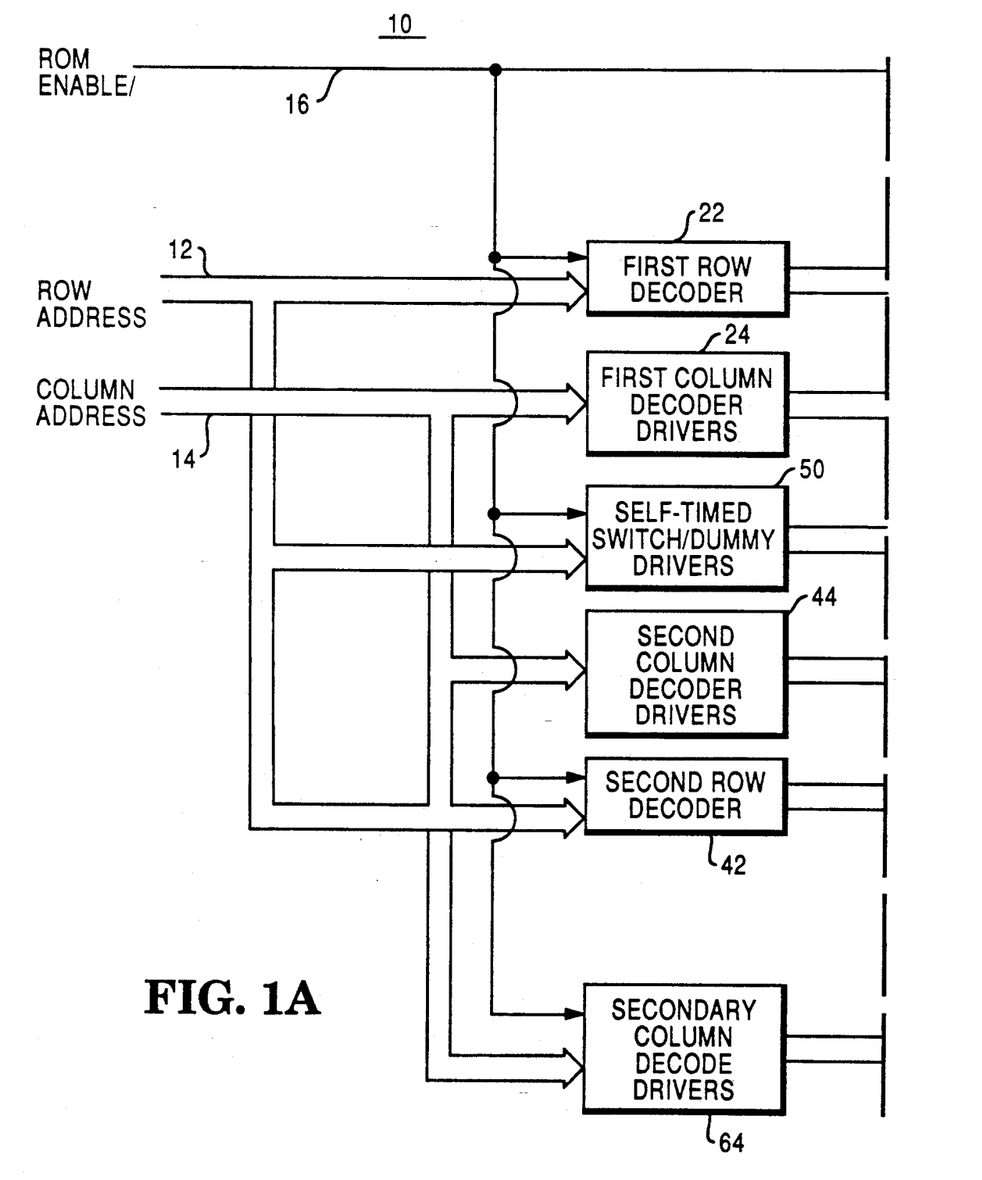
FIGS. 1A and 1B when joined form a functional block diagram of a pseudo-static ROM according to the invention.
Figure 1B:
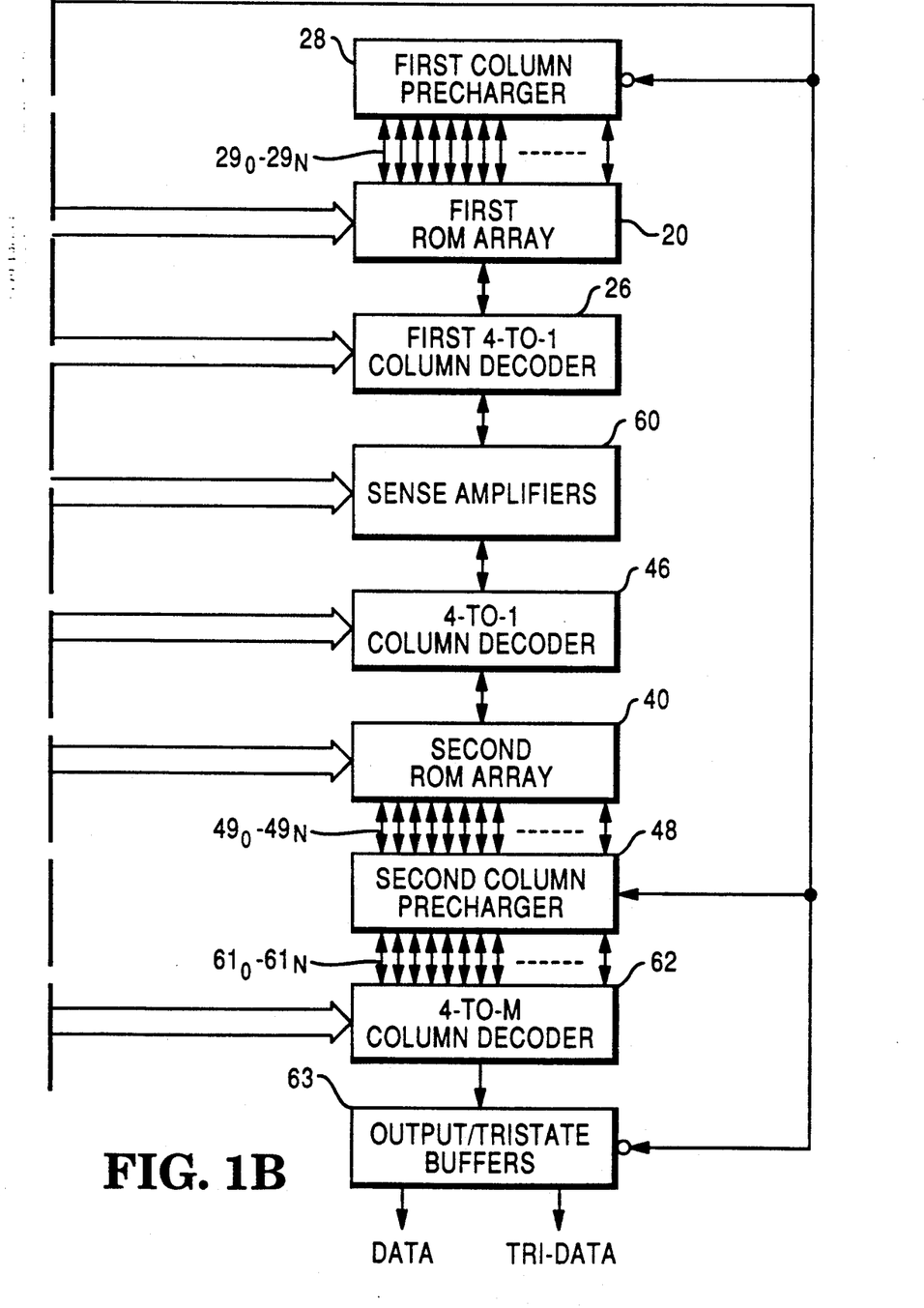

Referring to FIGS. 1A and 1B, there is shown a block diagram of a split array pseudo-static ROM 10 in accordance with the present invention. The ROM 10 is connected to a row address via a multi-line bus 12 and to a column address via multi-line bus 14. Row and column address signals are provided by decoders 22, 24, 42, 44, and 64.

A ROM ENABLE/ signal is provided by the system (not shown) to the ROM 10 via line 16. The ROM ENABLE/ signal is used to sequence a precharging of the ROM 10 for a subsequent READing of data from the ROM 10. The ROM ENABLE/ signal is typically derived from a system clock signal (not shown) in order to coordinate the READing of data.

The ROM 10 is a split array device, which means that the ROM is split or divided into two separate arrays of ROM cells. For the embodiment represented by FIG. 1, these two arrays are called the first ROM array 20, and the second ROM array 40. It is a common practice to split a memory array into first and second arrays, for example upper and lower arrays or side-by-side arrays, in order to locate the memory input and/or output circuits in the middle of the array and thereby cut down on bit line and word line capacitances. Splitting the memory array allows each of a set of sense amplifiers 60, which are located between the first ROM array 20 and the second ROM array 40, to sense a corresponding pair of bit lines with one of the pair of bit lines being selected as the accessed line and the other bit line of the pair being selected to be as the dummy line. Either bit line of a pair may be the accessed line, but as soon as the accessed line is selected, then the other bit line of the pair is selected as a dummy load. Each of the ROM arrays 20, 40 has a separate row decoder 22, 42 that is connected to the ROW ADDRESS signal. Each row decoder 22, 42 determines if the ROW ADDRESS signal on bus 12 is addressing a memory location in the first ROM array 20 or the second ROM array 40 respectively.

The COLUMN ADDRESS signals on bus 14 are connected to first and second decoder drivers 24, 44, which are connected to and drive 4-to-1 Column Decoders 26, 46 respectively. To conserve substrate area, each sense amplifier 60 is multiplexed among four different column addresses, although multiplexing of another number of column addresses, such as two or eight, is also possible. Out of the four possible column addresses, the 4-to-1 column decoders 26, 46, along with the row decoders 22, 42, connect the proper memory location to its sense amplifier 60.

The COLUMN ADDRESS signals on bus 14 are also connected to the secondary column decode drivers 64, which drive the secondary column decoder 62. The secondary column decoder 62 is used to connect the second ROM array bit lines $49_0-49_N$ through the second precharger 48 to the ROM output buffers 63 via lines $61_0-61_N$. The secondary column decoder 62 has at least the same order as the first or second column decoder 26, 46, but may be a multiple thereof.

The ROM ENABLE/ signal on line 16 is connected to a first column precharger 28 and a second column precharger 48. The first column precharger 28 is connected to the first ROM array 20 via lines $29_0$ to $29_N$ to precharge all of the first bit lines thereof at the beginning of each access (precharge cycle). The second column precharger 48 is connected to the second ROM array 40 via lines $49_0$ to $49_N$ to precharge the second bit lines at the beginning of each access (precharge cycle).

The ROM ENABLE/ signal is also connected via line 16 to the row decoders 22, 42, and decoder drivers 24, 44, and 64 in order to provide a means for de-selecting memory cells in the array during a precharge cycle.

The ROM ENABLE/ signal is further connected to self-timed switch and dummy drivers 50 to provide timing information to them. The self-timed switch and dummy drivers 50 are used to connect each of the sense amplifiers 60 with a dummy cell (not shown in Figs. 1A and 1B) which is used to assist in the READing of data. At the end of each READ cycle, the accessed data has been stabilized by its sense amplifier 60, and is transferred via its respective bit line of the bit lines $49_0-49_N$ to precharger 48 and secondary column decoder 62. From secondary column decoder 62, the accessed data is connected to an output buffer 63, which has both normal and tri-state outputs.

Figure 2:
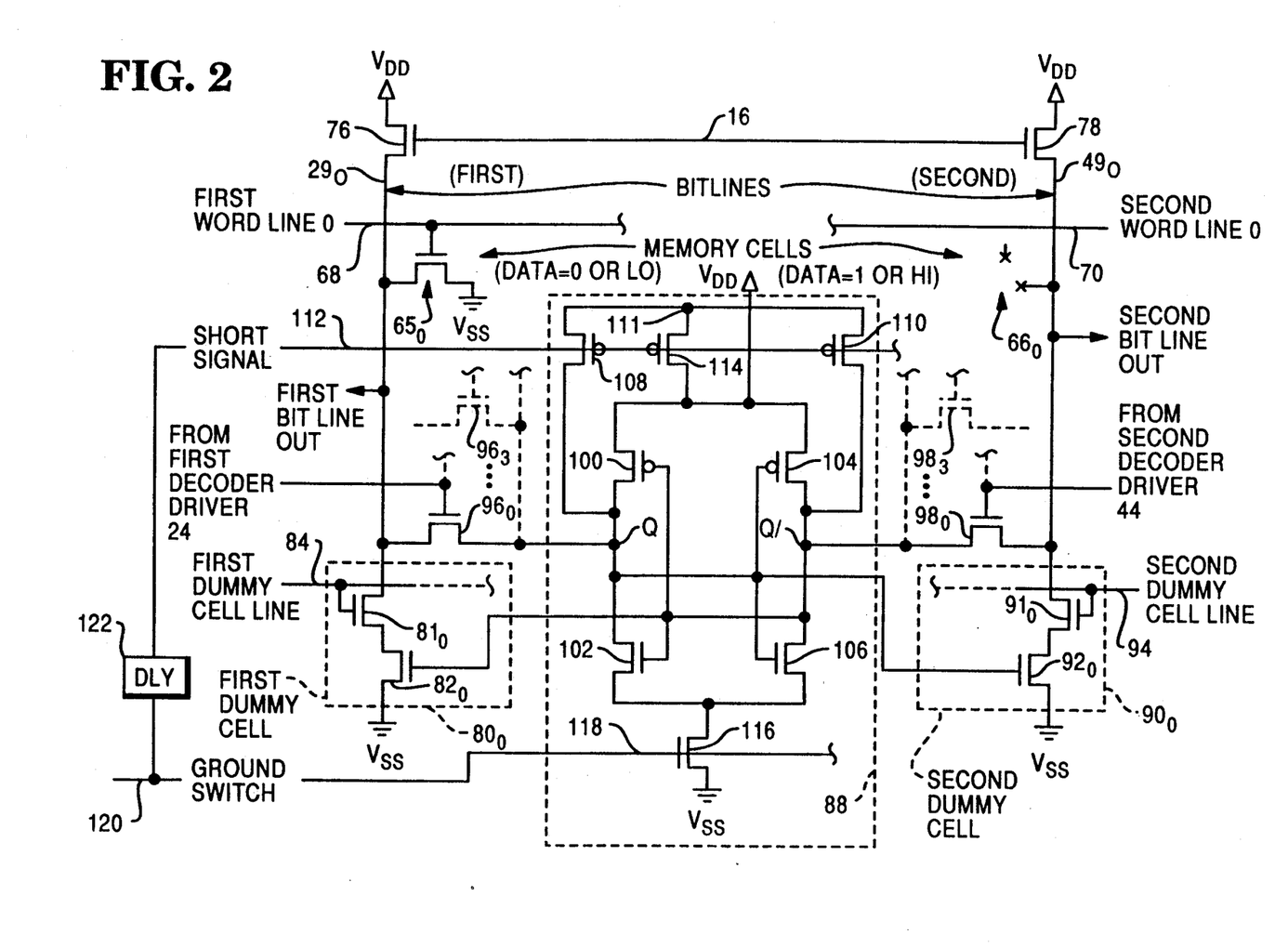
FIG. 2 is a simplified schematic diagram of a set of ROM memory cells, a sense amplifier, and a set of dummy cells according to the invention.

Referring now to FIG. 2, details of the ROM 10 will be explained. The ROM 10 is powered from a more positive reference voltage VDD and a less positive reference voltage VSS. A first bit cell 65 and a second bit cell 66 are shown in FIG. 2 as representative memory bit cells of the ROM 10. The first bit cell 65 is shown as a logic LO data bit since its gate is connected to a first word line $\_0$ 68. The second bit cell 66 is shown as a logic HI data bit since there is no active device connected between the second word line $\_0$ 70 and the second bit line $49_0$. Each bit cell 65, 66 is an N type FET, although those skilled in the art will appreciate that P-type FETs or bipolar transistors could alternatively be used. Each bit cell 65, 66 has its source connected to the less positive reference voltage VSS, and its drain connected to a respective bit line 72, 74.

First bit line $29_0$ is further connected to a source of a first precharger NMOS FET 76, and second bit line $49_0$ is further connected to a source of a second precharger FET 78. The drains of precharger FETs 76, 78 are connected to VDD. A gate of the first precharger FET 76 is connected to ROM ENABLE/ line 16 (see FIG. 1). Further, a gate of the second precharger FET 78 is also connected to ROM ENABLE/ line 16 (see FIG. 1). At the beginning of each precharge cycle the ROM ENABLE/ line 16 is driven with a logic HI of voltage VDD. With voltages of VDD on their gates, the precharger FETs 76, 78 are turned ON and the bit lines $29_0$, $49_0$ are precharged to (VDD−VT), where VT is the threshold voltage drop across the precharger FETs 76, 78 in a source-follower configuration. The bit lines $29_0$, $49_0$ because of their inherent capacitances will hold the precharge voltage of (VDD−VT) until it is actively discharged in some manner, such as by a memory bit cell.

An alternate embodiment of the precharger circuit (not shown) uses PMOS FETs as the precharger FETs 76 and 78. The polarity of the ROM enable signal on line 16 would be reversed for this alternative embodiment. Furthermore, the use of PMOS FETs as FETs 76 and 78 would allow the bit lines $29_0-29_N$, $49_0-49_N$ to precharge to VDD rather than (VDD-VT). The lower voltage (VDD-VT) of the first embodiment provides a faster access time, while the higher voltage (VDD) of the alternate embodiment provides a higher noise immunity.

The embodiment shown in FIG. 2, has the first bit line $29_0$ connected to a first dummy cell $80_0$ also. The first dummy cell $80_0$ has two N-type FETs $81_0$, $82_0$ connected in series. N-FET $81_0$ has its drain connected to the bit line $29_0$ and its gate connected to first dummy cell line 84. The first dummy cell line 84 connects to the gates of all of the dummy cells $80_0-80_N$ of the first ROM array 20 such that they are all switched ON or OFF together. The source of the N-FET $81_0$ is connected to the drain of N-FET $82_0$, which acts as a secondary dummy cell switch. The source of the N-FET $82_0$ is connected to VSS, and its gate is connected to a Q/ output of a sense amplifier 88. As stated above, the sense amplifier 88 is also used in conjunction with three other first dummy cells $80_1-80_3$ and their respective bit lines $29_1-29_3$, so the Q/ output of sense amplifier 88 is also connected to the gates of FETs $82_1-82_3$. The N-FETs $81_0-81_3$, $82_0-82_3$ are similar in dimensions and characteristics to memory bit cells 64, 66 such that the series combination of the selected pair of N-FETs $81_0-81_3$, $82_0-82_3$ has twice the ON resistance of the its respective memory bit cells $65_0-65_3$, $66_0-66_3$ (only logic LO $65_0$, and logic HI $66_0$ are shown in FIG. 2).

Second bit line $49_0$ is also connected to a second dummy cell $90_0$. The second dummy cell $90_0$ has two N-type FETs $91_0$, $92_0$ connected in series. N-FET $91_0$ has its drain connected to the bit line $49_0$ and its gate connected to second dummy cell line 94. The second dummy cell line 94 connects to the gates of all of the dummy cells $90_0$–$90_N$ of the second ROM array 40 such that they are all switched ON or OFF together. The source of the N-FET $91_0$ is connected to the drain of N-FET $92_0$, which acts as a secondary dummy cell switch. The source of the N-FET $92_0$ is connected to VSS, and its gate is connected to a Q output of a sense amplifier 88. As stated above, the sense amplifier 88 is also used in conjunction with three other second dummy cells $90_1$–$90_3$ and their respective bit lines $49_1$–$49_3$, so the Q output of sense amplifier 88 is also con the gates of FETs $92_1$–$92_3$. The N-FETs $91_0$–$91_3$, $92_0$–$92_3$ are similar in dimensions and characteristics to memory bit cells $65_0$–$65_3$, $66_0$–$66_3$ such that the series combination of the selected pair of N-FETs 910-913, $92_0$–$92_3$ has twice the ON resistance of the its respective memory bit cells $65_0$–$65_3$, $66_0$–$66_3$ (only logic LO $65_0$, and logic HI $66_0$ are shown in FIG. 2).

A pair of N-FET switches $96_0$, $98_0$ switchably connect the bit lines $29_0$, $49_0$ to outputs Q, Q/, respectively, of the sense amplifier 88 (which, as will be explained below, are also sense amplifier inputs). Three other pairs of N-FET switches $96_1$–$96_3$, $98_1$–$98_3$ (represented in dashed lines) switchably connect three other pairs of bit lines (not shown) to the sense amplifier 88. Taken together, N-FET switches $96_0$–$96_3$ comprise the output stage of the first 4-to-1 column decoder 26 (shown in FIG. 1B). Similarly, N-FET switches $98_0$–$98_4$ comprise the output stage of the second 4-to-1 column decoder 46 (shown in FIG. 1B). The gates of N-FET switches $96_0$–$96_3$, $98_0$–$98_3$ are driven by the first decoder drivers 24 and the second decoder drivers 44 respectively. During a READ cycle, at most one pair of switches $96_0$–$96_3$, $98_0$–$98_3$ are closed to connect the sense amplifier 88 to a pair of bit lines.

The sense amplifier 88 has a first complementary FET inverter that is made up of a series connection of P-FET 100 with N-FET 102 and a second complementary FET inverter that is made up of a series connection of P-FET 104 with N-FET 106. The drains of FETs 100, 102 are connected together at the Q output node of the sense amplifier 88. Similarly, the drains of the FETs 104, 106 are connected together at the Q/ output node of the sense amplifier 88. The gates of FETs 100, 102 are connected together as the input of the first complementary FET inverter. The gates of FETs 104, 106 are connected together as the input to the second complementary FET inverter. The input of the first complementary FET inverter is connected to the output Q/ of the second complementary FET inverter, and the input of the second complementary FET inverter is connected to the output Q of the first inverter forming a bistable or flip-flop device. Further, the sources of P-FETs 100, 104 are connected together to VDD to provide the more positive reference voltage to the sense amplifier.

Since each sense amplifier 88 is a bistable device, to prevent any unwanted biases each sense amplifier 88 must be placed in a neutral condition before it senses the bit lines $29_0$, $49_0$. The sense amplifier 88 is placed in a neutral condition by its own precharging operation that is separate from the bit line precharging operation. Two P-FETs 108, 110 provide the precharging from VDD of the sense amplified 88. They have their sources commonly connected to a node 111, their gates commonly connected to a short signal line 112, and their drains connected to Q and Q/, respectively. The embodiment shown in FIG. 2 shows a third P-FET 114 that has its gate connected to the gates of P-FETs 108, 110, its drain connected to node 111, and its source connected to VDD. Since the P-FET 114 is ON when P-FETs 108, 110 are ON and its condition is inconsequential when P-FETs 108, 110 are OFF, an alternate embodiment of the sense amplifier omits P-FET 114 and connects node 111 directly to VDD. To complete the precharging circuit, an N-FET 116 has its gate connected to ground switch line 118, its drain connected to the sources of N-FETs 102, 106, and its source connected to VSS. Operation of the precharging of the sense amplifier 88 is explained below.

In operation, the ground switch line 118 and the short signal line 112 may be driven by a common control signal from the SELF-TIMED SWITCH/DUMMY DRIVERS 50 (see FIG. 1A) on line 120. The short signal on line 112 may be slightly delayed by DLY 122 from the ground switch signal on line 118. At the beginning of a ROM cycle, a precharge cycle is executed. During the precharge cycle, N-FETs $96_0$–$96_3$, $98_0$–$98_3$ and 116 are turned OFF and P-FETs 108, 110, and 11.4 are turned ON. This causes both of the inputs Q and Q/ (which are also the outputs) of the sense amplifier 88 to be precharged to VDD. At the end of the precharge cycle, N-FET 116 is turned ON, and P-FETs 108, 110, and 114 are turned OFF (with possibly a brief delay with respect to the turn ON of N-FET 116).

Figure 3:
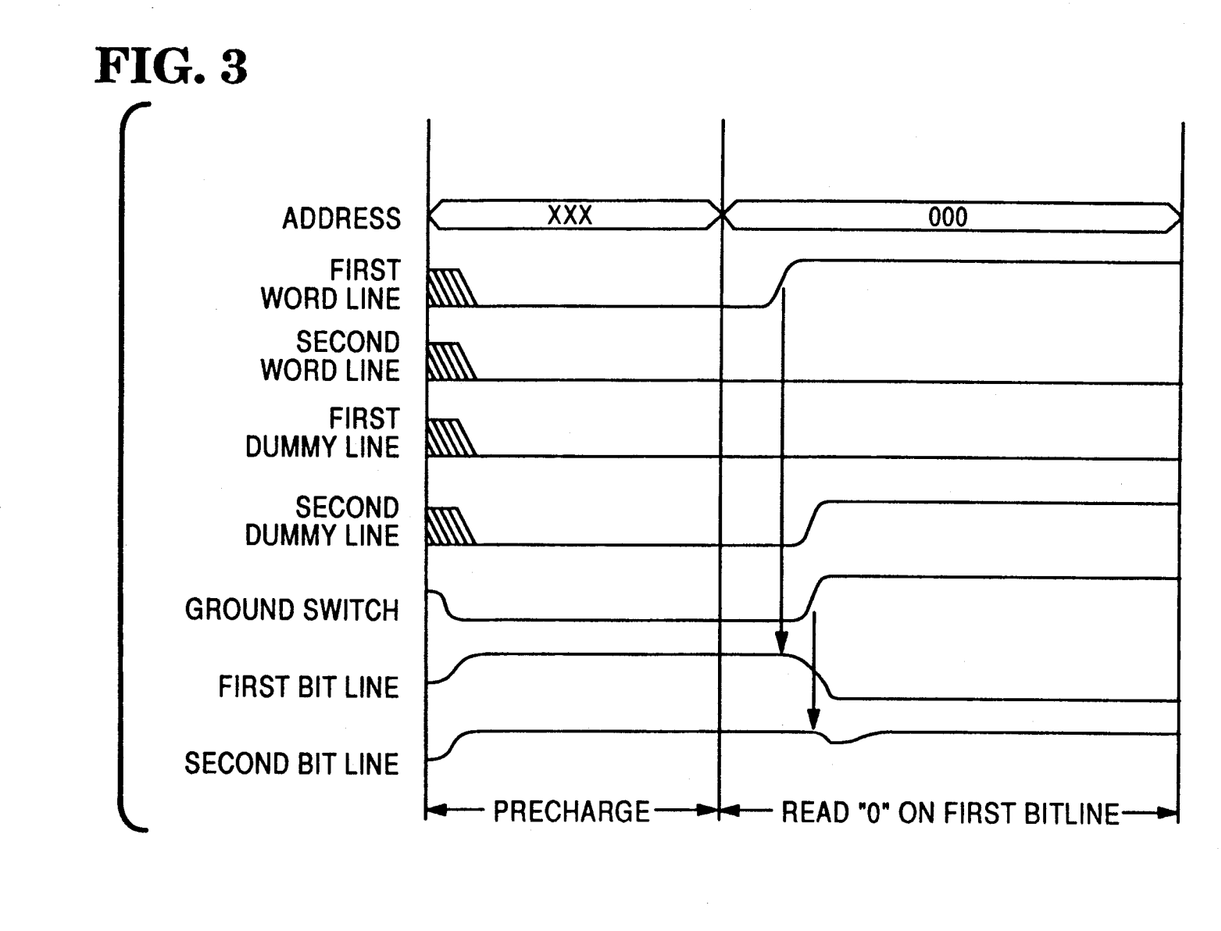
FIG. 3 is a simulated plot of various voltages during a READing of a logic LO from one of the set of memory cells.

Referring now to FIGS. 2 and 3, a READ of bit cell $65_0$ will be described. First, N-FETs $81_0$, $91_0$ are turned OFF and N-FETs 76, 78 are turned ON to precharge the bit lines $29_0$, $49_0$. During this time, word lines 68, 70 are held at logic LOs to keep all bit cells OFF. This precharging is separate from the precharging of the sense amplifier 88, but they are coordinated together. This precharges bit lines $29_0$, $49_0$ to (VDD—VT) as seen in the left portion of the FIRST and SECOND BIT LINE plots in FIG. 3.

Assuming that bit cell $65_0$ is to be READ after the precharge cycle, the first word line 68 will be driven with a logic HI to select a number of bit cells such as 650 which could be READ. Since bit cell $65_0$ stores a as a logic LO data bit, it is turned ON and starts to discharge the precharge on bit line $29_0$. At the same time, the dummy drivers 50 (see FIG. 1) drive the second dummy line 94 with a logic HI, which turns N-FET $91_0$ ON. N-FET 92 is already ON because of the precharge of output Q of the sense amplifier 88 that is connected to its gate. Thus, bit cell $65_0$ starts to discharge bit line $29_0$ at the same time that second dummy cell $90_0$, i.e. N-FETs $91_0$, $92_0$, starts to discharge bit line $49_0$. Since the N-FETs $65_0$, $91_0$, and $92_0$ have the same electrical characteristics, then the two FET dummy cell $90_0$ will discharge bit line $49_0$ at half the rate that memory bit cell $65_0$ will discharge bit line $29_0$. Immediately after the bit cell $65_0$ and the dummy cell $90_0$ have been driven by their respective control signals on lines 68 and 94, the N-FET 116 is turned ON by a logic HI on its gate, and the 4-to 1 Column Decoders 26, 46 drive N-FETs $96_0$, $98_0$ to the ON condition. The more discharged bit line $29_0$ will also pull the Q output towards logic LO and the input gates of FETs 104, 106 towards logic LO faster than the less discharged bit line $49_0$ will pull the Q/ output and the input gates of FETs 100, 102 towards logic LO. As the Q output goes LO, FET 104 begins to conduct, the Q/ output is pulled higher. This action causes FET 102 to conduct even more, which tends to pull the Q output even lower. It is this cross coupled positive feedback of the sense amplifier 88 that provides the rapid stabilization times and thereby shortened READ times. Thus, the sense amplifier 88 amplifies the difference between its input gates and establishes a stable state with Q at logic LO and Q/ at logic HI. As the Q output goes to logic LO, the gate of N-FET $92_0$ in the second dummy cell $90_0$ also goes to logic LO which turns N-FET $92_0$ OFF. The Q output will keep N-FET $92_0$ turned OFF until it is changed by the precharge cycle. With N-FET 92 turned OFF there can be no current flow and no power dissipation in the second bit line $49_0$ or the devices attached thereto. FIG. 3 shows voltage versus time plots a representative precharge and READ operation.

Figure 4:
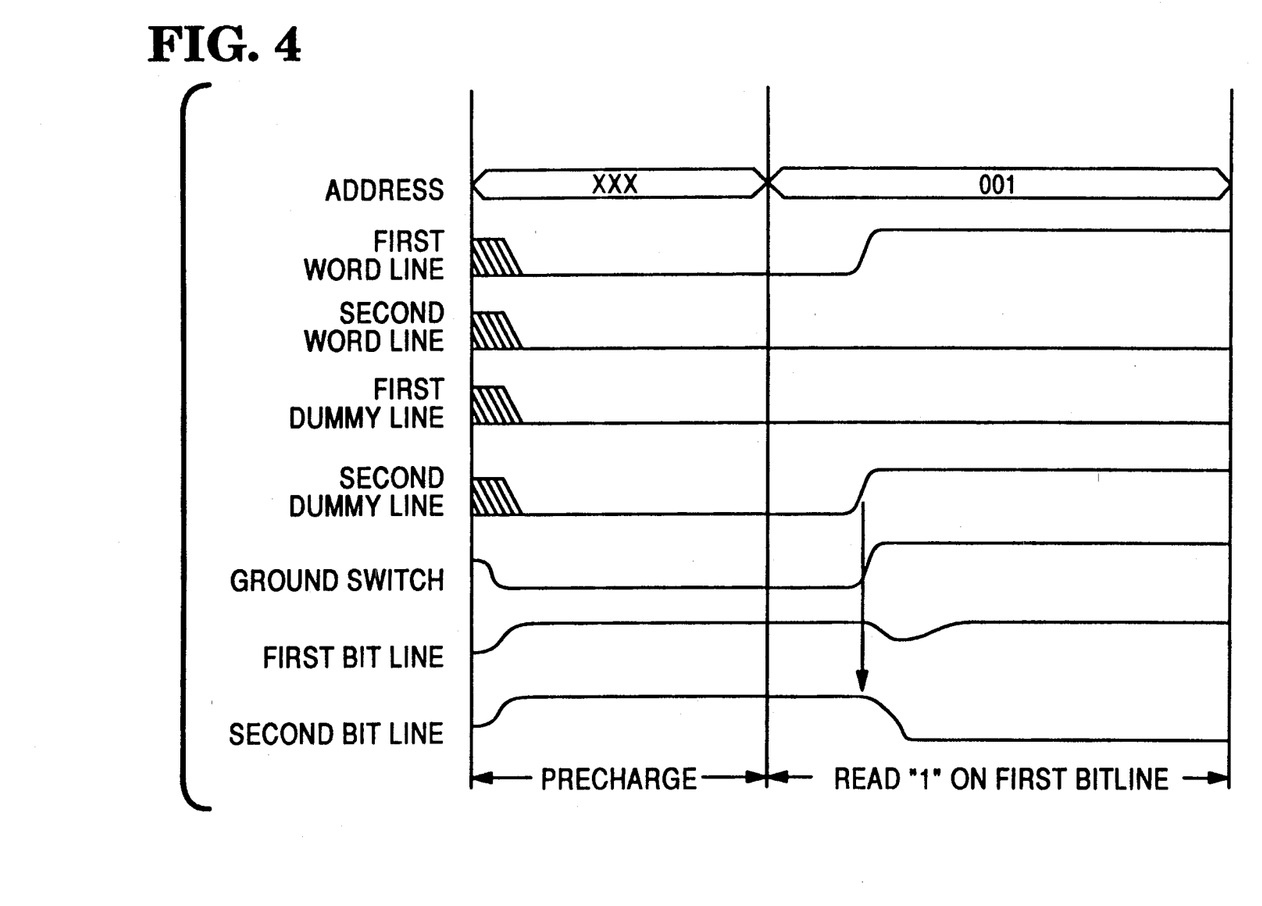
FIG. 4 is a simulated plot of various voltages during a READing of a logic HI from one of the set of memory cells.

Referring now to FIGS. 2 and 4, a READ of logic HI bit cell attached to bit line $29_0$ (not shown, but similar to bit cell $66_0$) instead of the logic LO bit cell $65_0$ will be described. First, N-FETs $81_0$, $91_0$ are turned OFF and N-FETs 76, 78 are turned ON to precharge the bit lines $29_0$, $49_0$. During this time, word lines 68, 70 are held at logic LOs to keep all bit cells OFF. This precharging is separate from the precharging of the sense amplifier 88, but they are coordinated together. This precharges bit lines $29_0$, $49_0$ to (VDD−VT) as seen in the left portion of the FIRST and SECOND BIT LINE plots in FIG. 4.

Assuming that the logic HI bit cell (not shown) is to be READ after the precharge cycle, the first word line 68 will be driven with a logic HI to select a number of bit cells could be READ. Since logic HI bit cell is a HI (not shown) data bit, it remains OFF and does not discharge the precharge on bit line $29_0$. At the same time, the dummy drivers 50 (see FIG. 1) drive the second dummy line 94 with a logic HI, which turns N-FET $91_0$ ON. N-FET $92_0$ is already ON because of the precharge of output Q of the sense amplifier 88 that is connected to its gate. Thus, bit line $29_0$ stays at the precharge voltage (VDD−VT) at the same time that second dummy cell $90_0$, i.e. N-FETs $91_0$, $92_0$, starts to discharge bit line $49_0$.

Immediately after the dummy cell $90_0$ has been driven by its control signals on line 94, the N-FET 116 is turned ON by a logic HI on its gate, and the 4-to-1 Column Decoders 26, 46 drive N-FETs $96_0$, $98_0$ to the ON condition. Because outputs Q and Q/ are both charged HI, FETs 102 and 106 will be ON and will be discharging the voltage on Q and Q/ respectively. At the same time, the dummy cell N-FETs $91_0$, $92_0$ will continue to discharge bit line $49_0$, while the logic HI bit cell (not shown) will not discharge bit line $29_0$. The discharging bit line $49_0$ will pull the Q/ output towards logic LO and the input gates of FETs 100, 102 towards logic LO, and the non-discharged bit line $29_0$ will pull the Q output and the input gates of FETs 104, 106 towards its logic HI. As the Q/ output goes LO, P-FET 100 begins to conduct, which pulls the Q output to a logic HI. This action causes FET 106 to conduct even more, which tends to pull the Q/ output even lower. It is this cross-coupled, positive feedback of the sense amplifier 88 that provides the rapid stabilization times and thereby shortened READ times. The sense amplifier 88 will amplify the difference between its input gates and establish a stable state with Q/ at logic LO and Q at logic HI. Since the Q output remains at logic HI, the Q/ output will be at logic LO. With N-FETS 106, 116 turned ON, and also N-FETs $91_0$, $92_0$ turned ON, there is no net voltage across N-FET $98_0$ and, therefore, no current will flow and no power will be dissipated in the second bit line $49_0$ or the devices attached thereto. Similarly, with Q at the precharged voltage, VDD, and the bit line $29_0$ at the voltage (VDD − VT) the net voltage across the N-FET $96_0$ will be VT, which is essentially zero, and insufficient to cause N-FET $96_0$ to conduct. During the time that N-FET $96_0$ is not conducting current, no power will be dissipated therein.

Thus, it will now be understood that there has been disclosed a low power pseudo-static ROM which has a fast access time with low power dissipation. While the invention has been particularly illustrated and described with reference to a preferred embodiment thereof, it will be understood by those skilled in the art that various changes in form, details, and applications may be made therein. It is accordingly intended that the appended claims shall cover all such changes in form, details and applications which do not depart from the true spirit and scope of the invention.

What is claimed as new and desired to be secured by Letters Patent of the United States is:

1. A semiconductor memory device, comprising:
    a first bit line formed on a semiconductor substrate;
    a second bit line formed on the semiconductor substrate;
    a first word line crossing over the first bit line;
    a dummy cell enable line also crossing over the first bit line;
    a memory cell formed at a cross over point of the first word line with the first bit line;
    a dummy cell formed at a cross over point of the dummy cell enable line with the first bit line;
    a sense amplifier having a first input and a second input is connected to the bit lines for sensing and amplifying a difference between the first bit line connected to the memory cell at the first input and the second bit line connected to the dummy cell at the second input for reading a data bit from the memory cell; and
    means connected to said sense amplifier for turning the dummy cell to a non-current conducting state if the first bit line is pulled towards logic LO by the memory cell;
    whereby the dummy cell does not dissipate power from the second bit line and the sense amplifier because it has been turned to the non-current conducting state.

2. A semiconductor memory device as set forth in claim 1, further comprising:
    first precharging means connected to the first input of the sense amplifier for precharging the first input to a first voltage; and
    second precharging means connected to the second input of the sense amplifier for precharging the second input to the first voltage.

3. A semiconductor memory device as set forth in claim 2, wherein the first voltage is a more positive reference potential.

4. A semiconductor memory device as set forth in claim 2, further comprising:
    third precharge means for precharging the first bit line to a second voltage; and
    fourth precharge means for precharging the second bit line to the second voltage.

5. A semiconductor memory device as set forth in claim 4, wherein the second voltage is a more positive reference potential that is diminished by a threshold voltage of the third and fourth precharge means with respect to the first voltage.

6. A semiconductor memory device as set forth in claim 1, wherein the sense amplifier includes two complementary FET inverters that have their inputs cross coupled to their outputs.

7. A semiconductor memory device as set forth in claim 1, wherein the data bit READ from the memory cell is a logic HI if a control input terminal and an output terminal of the memory cell are not electrically connected to the word line.

8. A semiconductor memory device as set forth in claim 1, wherein the data bit READ from the memory cell is a logic LO if a control input terminal and an output terminal of the memory cell are electrically connected to the word line.

9. A semiconductor memory device as set forth in claim 1, wherein each bit line is connected to a respective dummy cell and each dummy cell has two transistors connected in series.

10. An array of semiconductor memory devices, comprising:
    a first plurality of bit lines formed on a semiconductor substrate;
    a second plurality of bit lines formed on the semiconductor substrate;
    a first plurality of word lines crossing over the first plurality of bit lines;
    a first dummy cell enable line also crossing over the first plurality of bit lines;
    a second dummy cell enable line crossing over the second plurality of bit lines;
    a plurality of memory cells, each formed at a cross over point of each of the first plurality of word lines with each of the first plurality of bit lines;
    a first plurality of dummy cells, each formed at a cross over point of the first dummy cell enable line with each of the first plurality of bit lines;
    a second plurality of dummy cells, each formed at a cross over point of the second dummy cell enable line with each of the second plurality of bit lines;
    sense amplifier means for sensing and amplifying a difference between one of the first plurality of bit lines connected to a selected one of said plurality of memory cells at a first input of said sense amplifier means and one of the second plurality of bit lines connected to a selected one of the plurality of second dummy cells at a second input of said sense amplifier means for reading a data bit from the selected memory cell; and
    means connected to said sense amplifier for turning the selected second dummy cell to a non-current conducting state if the first bit line is pulled towards logic LO by the selected memory cell;
    whereby the selected second dummy cell does not dissipate power from the second bit line and the sense amplifier because the selected second dummy cell has been turned to the non-current conducting state.

11. An array of semiconductor memory devices, as set forth in claim 10, further comprising:
    first precharging means connected to the first input of the sense amplifier for precharging the first input to a first voltage; and
    second precharging means connected to the second input of the sense amplifier for precharging the second input to the first voltage.

12. An array of semiconductor memory devices, as set forth in claim 11, wherein the first voltage is a more positive reference potential.

13. An array of semiconductor memory devices, as set forth in claim 11, further comprising:
    third precharge means for precharging each of the first plurality of bit lines to a second voltage; and
    fourth precharge means for precharging each of the second plurality of bit lines to the second voltage.

14. An array of semiconductor memory devices, as set forth in claim 13, wherein the second voltage is a more positive reference potential that is diminished by a threshold voltage of the third and fourth precharge means with respect to the first voltage.

15. An array of semiconductor memory devices, as set forth in claim 10, wherein the sense amplifier includes two complementary FET inverters that have their inputs cross coupled to their outputs.

16. An array of semiconductor memory devices, as set forth in claim 10, wherein each dummy cell has two transistors connected in series.

17. An array of semiconductor memory devices, as set forth in claim 10, wherein the data bit READ from the selected memory cell is a logic HI if a control input terminal and an output terminal of the memory cell are not electrically connected to the word line.

18. An array of semiconductor memory devices, as set forth in claim 10, wherein the data bit READ from the selected memory cell is a logic LO if a control input terminal and an output terminal of the memory cell are electrically connected to the word line.

19. An array of semiconductor memory devices, as set forth in claim 10, wherein the memory cells are divided into a first array and a second array.

20. An array of semiconductor memory devices, as set forth in claim 19, wherein the sense amplifier is located between the first array and the second array.

* * * * *